(12) United States Patent
Zhou et al.

(10) Patent No.: US 8,455,607 B2
(45) Date of Patent: *Jun. 4, 2013

(54) CURABLE LIQUID COMPOSITE LIGHT EMITTING DIODE ENCAPSULANT

(75) Inventors: Weijun Zhou, Sugar Land, TX (US); Binghe Gu, Midland, MI (US); John W. Lyons, Midland, MI (US); Allen S. Bulick, Lansdale, PA (US); Garo Khanarian, Princeton, NJ (US); Paul J. Popa, Auburn, MI (US); John R. Ell, Quakertown, PA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 78 days.

This patent is subject to a terminal disclaimer.

(21) Appl. No.: 13/211,363

(22) Filed: Aug. 17, 2011

(65) Prior Publication Data
US 2013/0045292 A1 Feb. 21, 2013

(51) Int. Cl.
*C08G 77/00* (2006.01)

(52) U.S. Cl.
USPC .......................................................... 528/43

(58) Field of Classification Search
USPC .......................................................... 528/43
See application file for complete search history.

(56) References Cited

U.S. PATENT DOCUMENTS

| 3,801,535 | A | 4/1974 | Joschko |
| 4,318,939 | A | 3/1982 | Wong |
| 6,274,924 | B1 | 8/2001 | Carey et al. |
| 7,470,974 | B2 | 12/2008 | Bhandarkar et al. |
| 7,521,727 | B2 | 4/2009 | Khanarian et al. |
| 7,595,113 | B2 | 9/2009 | Miyoshi |
| 2005/0006651 | A1 | 1/2005 | LeBoeuf et al. |
| 2006/0105484 | A1 | 5/2006 | Basin et al. |
| 2007/0148476 | A1 | 6/2007 | Khanarian et al. |
| 2008/0160323 | A1 | 7/2008 | Mosley et al. |
| 2009/0039313 | A1 | 2/2009 | Conner et al. |
| 2009/0146324 | A1 | 6/2009 | Auld et al. |
| 2009/0163654 | A1 | 6/2009 | Hirano |
| 2010/0025724 | A1 | 2/2010 | Bae et al. |
| 2010/0155871 | A1 | 6/2010 | Hirano |
| 2010/0221666 | A1 | 9/2010 | Popa et al. |
| 2010/0291374 | A1 | 11/2010 | Akarsu et al. |

FOREIGN PATENT DOCUMENTS

| WO | 03011944 | 2/2003 |
| WO | 2007053396 | 5/2007 |

OTHER PUBLICATIONS

Chen, et al., Synthesis and characterization of oligomeric phenylsilsesquioxane-titania hybrid optical thin films, Materials Chemistry and Physics 83, 71-77 (2004).

Kim, et al., Thermally stable transparent sol-gel based siloxane hybrid material with high refractive index for light emitting diode (LED) encapsulation, Chemistry of materials 22, 3549-55 (May 13, 2010).

Ravirajan, et al. The effect of polymer optoelectronic properties on the performance of multilayer hybrid polymer/TiO2 solar cells, Advanced functional materials, v. 15, No. 4, pp. 609-618 (2005).

Copending U.S. Appl. No. 13/109,053, filed 2011.
Copending U.S. Appl. No. 13/211,378, filed 2011.
Copending U.S. Appl. No. 13/109,045, 2011.

*Primary Examiner* — Kuo-Liang Peng
(74) *Attorney, Agent, or Firm* — Thomas S. Deibert

(57) ABSTRACT

A curable liquid polysiloxane/$TiO_2$ composite for use as a light emitting diode encapsulant is provided, comprising: a polysiloxane with $TiO_2$ domains having an average domain size of less than 5 nm, wherein the curable liquid polysiloxane/$TiO_2$ composite contains 20 to 60 mol % $TiO_2$ (based on total solids); wherein the curable liquid polysiloxane/$TiO_2$ composite exhibits a refractive index of >1.61 to 1.7 and wherein the curable liquid polysiloxane/$TiO_2$ composite is a liquid at room temperature and atmospheric pressure. Also provided is a light emitting diode manufacturing assembly.

10 Claims, No Drawings

CURABLE LIQUID COMPOSITE LIGHT EMITTING DIODE ENCAPSULANT

The present invention relates to a curable liquid polysiloxane/TiO$_2$ composite comprising: a polysiloxane with TiO$_2$ domains having an average domain size of less than 5 nm; wherein the polysiloxane has an average compositional formula:

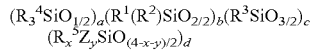
$(R_x^5Z_ySiO_{(4-x-y)/2})_d$ wherein the curable liquid polysiloxane/TiO$_2$ composite contains 20 to 60 mol % TiO$_2$ (based on total solids); wherein the curable liquid polysiloxane/TiO$_2$ composite exhibits a refractive index of >1.61 to 1.7 and wherein the curable liquid polysiloxane/TiO$_2$ composite is a liquid at room temperature and atmospheric pressure. The present invention further relates to a light emitting diode manufacturing assembly.

A light emitting diode (LED) device typically comprises an LED die that is encapsulated by an optically clear and thermally stable material. The encapsulating material generally serves at least one of three functions, namely (1) it facilitates incorporation of the light emitting diode into a device; (2) it provides protection for the fragile wiring for the light emitting diode; and (3) it behaves as a refractive intermediary between the high index die and low index air. In some LED devices, a preformed plastic lens or glass lens is affixed or bonded to a package in which the LED die is mounted. A curable liquid encapsulant material is then injected into the cavity between the LED die and the plastic lens (or glass lens) and is subsequently cured to completely seal the LED die.

There is an increasing trend of directly molding a curable liquid encapsulant material onto an LED die using an in-line molding process. In these in-line molding processes, a curable liquid encapsulant material is injected or potted into a mold cavity containing a LED die (or into which an LED die is immersed) and then curing the encapsulant material, wherein the encapsulant material both encapsulates the LED die and forms a lens for shaping the light emitted from the LED die. Such in-line molding processes eliminate the prefabrication and assembly of a lens into the LED device. As a result, such in-line molding processes promise more cost effective high volume manufacturing of LED devices.

Accordingly, high refractive index polymers are of interest as lens and encapsulant materials for use in light emitting diode device applications. For example, in the manufacture of LED devices, manufacturers desire optical polymers with high transparency in the visible region, high refractive indices (i.e., refractive indices of approximately 1.60 or higher), and excellent heat stability over tens of thousands of hours of operation. The use of high refractive index materials can considerably improve the light extraction efficiency from an LED die at the same drive current, hence making the LED device more energy efficient. Additionally the LED device industry uses liquid prepolymers, which are then cured in place after much of the device has already been assembled. Therefore the curing polymer system must show minimal shrinkage, and must be curable under conditions which do not harm the assembled device.

Materials conventionally used to encapsulate LED dies include epoxy resins and silicones. Conventional epoxy resins tend to exhibit poor light stability (i.e., they tend to yellow over time) over time following exposure to ultraviolet light or to elevated thermal conditions. This yellowing leads to a reduction in light output from a LED device over time. On the other hand, conventional silicones exhibit much better heat and light stability. As a result, silicones are becoming the dominant encapsulant for use in LED devices. Conventional silicone encapsulants; however, exhibit refractive indices ranging from 1.41 to 1.57 (measured at 550 nm). Moreover, it has proven difficult to achieve refractive indices of higher than about 1.6 (measured at 550 nm) without compromising other key performance properties such as flowability in the uncured state.

The refractive index of the encapsulant plays an important role in determining how much light is extracted from the LED device. This is due to total, or very high internal reflection of light as it passes from the solid-state high refractive index LED die to a low index polymer medium. Typical LED dies have refractive indices of approximately 2.5. Thus, there is great interest in obtaining silicone encapsulants having higher refractive indices, while maintaining flowability in the uncured state.

The refractive index of a polymer is determined by the molar refractivities of its constituent groups. Commercial silicone monomers are predominantly combinations of aliphatic groups and phenyl groups. This effectively limits the refractive index in traditional curable liquid silicones to an upper end of 1.57 to 1.58. The refractive index of poly(diphenylsiloxane) is 1.61, but it is a solid polymer. Since many applications require liquid prepolymers, it is necessary to blend lower glass transition temperature ($T_g$) monomers with diphenylsiloxane monomers in order to obtain a liquid, leading to a reduction in the refractive index of the blended material. This leads to an upper limit on the refractive index of 1.57 to 1.58, as mentioned.

Two approaches have been suggested for enhancing the refractive index of silicone polymers. One approach is to blend organopolysiloxane with a refractive index enhancer such as TiO$_2$. Another approach is to react silicone precursors with titanium alkoxides. The refractive index exhibited by such materials; however, is lower than expected because of inhomogeneity of the product produced and the composites are difficult to process (i.e., they are inhomogenious and non-flowable).

One group of liquid prepolymers are disclosed by Conner et al. in United States Patent Application Publication No. 2009/0039313. Conner et al. disclose a (thio)phenoxyphenyl phenyl silane composition comprising a (thio)phenoxyphenyl phenyl silane having formula I

wherein: Ph$^1$ is a phenyl ring having Ph$^2$-Q-, —Si(Ph$^3$)(OR)$_2$ and four hydrogen atoms as substituents; Ph$^2$-Q is a (thio) phenoxy group where Ph$^2$ is phenyl and Q is selected from oxygen atom, sulfur atom, and combinations thereof; Ph$^2$-Q is in a position on the Ph$^1$ phenyl ring which is ortho-, meta-, or para-relative to the Si atom; Ph$^3$ is phenyl; and R is independently selected from a hydrogen atom, a C$_{1-10}$ hydrocarbon radical, and combinations thereof; wherein the C$_{1-10}$ hydrocarbon radical is independently selected from: linear, branched, or cyclic C$_{1-10}$ alkyl; phenyl; substituted phenyl; arylalkyl; and combinations thereof.

Notwithstanding, there remains a need for transparent high refractive index materials for use in the manufacture of light emitting diodes. In particular, there remains a need for light emitting diode encapsulant formulations having high refractive index, good thermal stability, and transparency which are liquid, or which form curable compositions which are liquid before curing, during some portion of curing, or both. In many cases, silicone composites are needed which can be cured into elastomers. In these cases, it is convenient to have liquid silicone composite based precursors which can be crosslinked to form cured compositions.

The present invention provides a curable liquid polysiloxane/TiO$_2$ composite for use as a light emitting diode encapsulant, comprising (consisting essentially of): a polysiloxane with TiO$_2$ domains having an average domain size of less than 5 nm (preferably as determined by transmission electron microscopy (TEM)); wherein the polysiloxane has an average compositional formula:

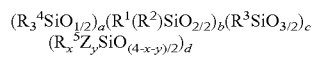

wherein each R$^1$ and R$^3$ is independently selected from a C$_{6-10}$ aryl group and a C$_{7-20}$ alkylaryl group; wherein each R$^2$ is a phenoxyphenyl group; wherein each R$^4$ is independently selected from a C$_{1-10}$ alkyl group, a C$_{7-10}$ arylalkyl group, a C$_{7-10}$ alkylaryl group and a C$_{6-10}$ aryl group; wherein each R$^5$ is independently selected from a C$_{1-10}$ alkyl group, a C$_{7-10}$ arylalkyl group, a C$_{7-10}$ alkylaryl group, a C$_{6-10}$ aryl group and a phenoxyphenyl group; wherein each Z is independently selected from a hydroxyl group and a C$_{1-10}$ alkoxy group; wherein $0 \leq a \leq 0.005$; wherein $0.8495 \leq b \leq 0.9995$; wherein $0.0005 \leq c \leq 0.10$; wherein $0 < d \leq 0.15$; wherein each x is independently selected from 0, 1 and 2; wherein each y is independently selected from 1, 2 and 3; wherein a+b+c+d=1; wherein the polysiloxane comprises, as initial components: (i) D units having a formula R$^1$(R$^2$)Si(OR$^6$)$_2$; (ii) T units having a formula R$^3$Si(OR$^7$)$_3$; (iii) optionally, M units having a formula R$_3^4$SiOR$^8$; and, (iv) optionally, Q units having a formula Si(OR$^9$)$_4$; wherein each R$^6$, R$^7$, R$^8$ and R$^9$ is independently selected from a hydrogen atom, a C$_{1-10}$ alkyl group, a C$_{7-10}$ arylalkyl group, a C$_{7-10}$ alkylaryl group and a C$_{6-10}$ aryl group; wherein the D units contain >1 ppb to ≦100 ppm in combined total of all target contaminants having formulae selected from R$^1$—O—(R$^2$)Si(OR$^6$)$_2$; R$^2$—O—(R$^1$)Si(OR$^6$)$_2$; R$^1$(R$^{10}$)Si(OR$^6$)$_2$; and, R$^2$(R$^{11}$)Si(OR$^6$)$_2$; wherein R$^{10}$ is selected from a phenol-oxy-phenyl group and a phenyl-oxy-(hydroxy)phenyl group and wherein R$^{11}$ is a hydroxyphenyl group; wherein the curable liquid polysiloxane/TiO$_2$ composite contains 20 to 60 mol % TiO$_2$ (based on total solids); and, wherein the curable liquid polysiloxane/TiO$_2$ composite exhibits a refractive index of >1.61 to 1.7 and wherein the curable liquid polysiloxane/TiO$_2$ composite is a liquid at room temperature and atmospheric pressure.

The present invention also provides a curable liquid polysiloxane/TiO$_2$ composite for use as a light emitting diode encapsulant, comprising (consisting essentially of): a polysiloxane with TiO$_2$ domains having an average domain size of less than 5 nm (preferably as determined by transmission electron microscopy (TEM)); wherein the polysiloxane has an average compositional formula:

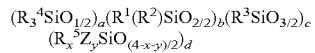

wherein each R$^1$ and R$^3$ is independently selected from a C$_{6-10}$ aryl group and a C$_{7-20}$ alkylaryl group; wherein each R$^2$ is a phenoxyphenyl group; wherein each R$^4$ is independently selected from a C$_{1-10}$ alkyl group, a C$_{7-10}$ arylalkyl group, a C$_{7-10}$ alkylaryl group and a C$_{6-10}$ aryl group; wherein each R$^5$ is independently selected from a C$_{1-10}$ alkyl group, a C$_{7-10}$ arylalkyl group, a C$_{7-10}$ alkylaryl group, a C$_{6-10}$ aryl group and a phenoxyphenyl group; wherein each Z is independently selected from a hydroxyl group and a C$_{1-10}$ alkoxy group; wherein $0 \leq a \leq 0.005$; wherein $0.8495 \leq b \leq 0.9995$; wherein $0.0005 \leq c \leq 0.10$; wherein $0 < d \leq 0.15$; wherein each x is independently selected from 0, 1 and 2; wherein each y is independently selected from 1, 2 and 3; wherein a+b+c+d=1; wherein the polysiloxane comprises, as initial components: (i) D units having a formula R$^1$(R$^2$)Si(OR$^6$)$_2$; (ii) T units having a formula R$^3$Si(OR$^7$)$_3$; (iii) optionally, M units having a formula R$_3^4$SiOR$^8$; and, (iv) optionally, Q units having a formula Si(OR$^9$)$_4$; wherein each R$^6$, R$^7$, R$^8$ and R$^9$ is independently selected from a hydrogen atom, a C$_{1-10}$ alkyl group, a C$_{7-10}$ arylalkyl group, a C$_{7-10}$ alkylaryl group and a C$_{6-10}$ aryl group; wherein the D units contain >1 ppb to ≦100 ppm in combined total of all target contaminants having formulae selected from R$^1$—O—(R$^2$)Si(OR$^6$)$_2$; R$^2$—O—(R$^1$)Si(OR$^6$)$_2$; R$^1$(R$^{10}$)Si(OR$^6$)$_2$; and, R$^2$(R$^{11}$)Si(OR$^6$)$_2$; wherein R$^{10}$ is selected from a phenol-oxy-phenyl group and a phenyl-oxy-(hydroxy)phenyl group and wherein R$^{11}$ is a hydroxyphenyl group; wherein the curable liquid polysiloxane/TiO$_2$ composite is prepared by: (a) combining in an aprotic solvent: (i) the D units; (ii) the T units; (iii) any optional M units; and, (iv) any optional Q units; (b) adding to the combination of (a) an acid in a miscible mixture of water and an alcohol to form a reaction mixture; (c) allowing the reaction mixture to react; (d) adding an organo-titanate in an aprotic solvent to the reacted reaction mixture of (c); (e) adding water to the product of (d); (f) heating the product of (e) and allowing it to react; and, (g) purifying the product of (f) to provide the curable liquid polysiloxane/TiO$_2$ composite; wherein the curable liquid polysiloxane/TiO$_2$ composite contains 20 to 60 mol % TiO$_2$ (based on total solids); wherein the curable liquid polysiloxane/TiO$_2$ composite exhibits a refractive index of >1.61 to 1.7; and, wherein the curable liquid polysiloxane/TiO$_2$ composite is a liquid at room temperature and atmospheric pressure.

The present invention also provides a light emitting diode manufacturing assembly, comprising: a support structure having a plurality of individual semiconductor light emitting diode dies; and, a mold having a plurality of cavities corresponding with the plurality of individual semiconductor light emitting diode dies; wherein the plurality of cavities is filled with a curable liquid polysiloxane/TiO$_2$ composite of the present invention; and wherein the support structure and the mold are oriented such that the plurality of individual semiconductor light emitting diode dies are each at least partially immersed in the curable liquid polysiloxane/TiO$_2$ composite contained in the plurality of cavities.

DETAILED DESCRIPTION

Siloxane polymers have established many uses in the electronics industry. For example, siloxane polymers have use as underfill formulations, protective coatings, potting agents, die bonding agents, encapsulants and as lenses for light emitting diodes. In many applications in the electronics industry; however, special requirements are presented given the constraints involved wherein the material used must be in a liquid curable form. That is, in such applications (e.g., underfill and lens molding), a partially or completely closed space is filled with liquid curable material, which is subsequently cured. For example, in the manufacture of lenses for light emitting diodes a closed mold is commonly used to form the lens. The liquid curable material is dispensed or injected into the mold cavity and then cured. In such molding processes, it is desirable to minimize the content of volatiles in the liquid curable material used to avoid the need to facilitate off gassing or the removal solvent from the system.

Also, in many applications (e.g., manufacture of lenses for light emitting diodes) it is desirable that the liquid curable material exhibit little or no undesired color formation. The overall purity of the raw materials used in the preparation of the liquid curable material is considered important. Nevertheless, it has been found that the overall purity of the raw materials (in particular of the D units) alone is not enough.

While not an issue for polysiloxane encapsulants, it has been surprisingly found that certain impurities present in D units used in the preparation of polysiloxane/TiO$_2$ composites can interact with the TiO$_2$ to create undesired color formations. Specifically, it has been surprisingly found that target contaminants having formulae selected from R$^1$—O—(R$^2$)Si(OR$^6$)$_2$; R$^2$—O—(R$^1$)Si(OR$^6$)$_2$; R$^1$(R$^{10}$)Si(OR$^6$)$_2$; and, R$^2$(R$^{11}$)Si(OR$^6$)$_2$; wherein R$^{10}$ is selected from a phenol-oxy-phenyl group and a phenyl-oxy-(hydroxy)phenyl group and wherein R$^{11}$ is a hydroxyphenyl group; can interact with TiO$_2$ to create undesired color formations when preparing polysiloxane/TiO$_2$ composites. The target contaminants are difficult to separate from the D units. Accordingly, it is possible to obtain high purity D units that still contain an undesirably high concentration of at least one of the target contaminants.

The curable liquid polysiloxane/TiO$_2$ composite of the present invention is designed to facilitate the manufacture of light emitting diodes having a semiconductor light emitting diode die (preferably a plurality of semiconductor light emitting diode dies), wherein the semiconductor light emitting diode die(s) is(are) at least partially encapsulated (preferably, completely encapsulated) within the curable liquid polysiloxane/TiO$_2$ composite. Specifically, the curable liquid polysiloxane/TiO$_2$ composite of the present invention is surprisingly liquid despite the high TiO$_2$ loading with minimal (<4 wt %, preferably <2.5 wt %) or no solvent (i.e., neat). The curable liquid polysiloxane/TiO$_2$ composite of the present invention also exhibits a high refractive index (>1.61). The curable liquid polysiloxane/TiO$_2$ composite of the present invention is prepared using D units that contain ≦100 ppm in combined total of all the target contaminants having formulae selected from R$^1$—O—(R$^2$)Si(OR$^6$)$_2$; R$^2$—O—(R$^1$)Si(OR$^6$)$_2$; R$^1$(R$^{10}$)Si(OR$^6$)$_2$; and, R$^2$(R$^{11}$)Si(OR$^6$)$_2$; wherein R$^{10}$ is selected from a phenol-oxy-phenyl group and a phenyl-oxy-(hydroxy)phenyl group and wherein R$^{11}$ is a hydroxyphenyl group; to reduce or eliminate undesired color formation. These properties of the curable liquid polysiloxane/TiO$_2$ composite of the present invention make it ideally suitable for use in the manufacture of semiconductor light emitting diodes.

The curable liquid polysiloxane/TiO$_2$ composite of the present invention is curable using well known methods. Preferably, the curable liquid polysiloxane/TiO$_2$ composite is thermally curable (preferably upon heating at 100 to 200° C. for 10 to 120 minutes).

The curable liquid polysiloxane/TiO$_2$ composite of the present invention, comprises (preferably consists essentially of): a polysiloxane with TiO$_2$ domains having an average domain size of less than 5 nm (preferably ≦3 nm) as determined by transmission electron microscopy (TEM); wherein the polysiloxane has an average compositional formula:

$$(R_3^4SiO_{1/2})_a(R^1(R^2)SiO_{2/2})_b(R^3SiO_{3/2})_c(R_x^5Z_ySiO_{(4-x-y)/2})_d$$

wherein each R$^1$ and R$^3$ is independently selected from a C$_{6-10}$ aryl group and a C$_{7-20}$ alkylaryl group (preferably both R$^1$ and R$^3$ are phenyl groups); wherein each R$^2$ is a phenoxyphenyl group, wherein the phenoxyphenyl group is bound with the silicon to form at least one of three different isomers, namely an ortho-phenoxyphenyl silane group, a meta-phenoxyphenyl silane group, or a para-phenoxyphenyl silane group; wherein each R$^4$ is independently selected from a C$_{1-10}$ alkyl group, a C$_{7-10}$ arylalkyl group, a C$_{7-10}$ alkylaryl group and a C$_{6-10}$ aryl group (preferably a C$_{1-5}$ alkyl group, a C$_{7-10}$ arylalkyl group, a C$_{7-10}$ alkylaryl group and a phenyl group; more preferably a C$_{1-5}$ alkyl group and a phenyl group; most preferably a methyl group and a phenyl group); wherein each R$^5$ is independently selected from a C$_{1-10}$ alkyl group, a C$_{7-10}$ arylalkyl group, a C$_{7-10}$ alkylaryl group, a C$_{6-10}$ aryl group and a phenoxyphenyl group (preferably a C$_{1-5}$ alkyl group, a C$_{7-10}$ arylalkyl group, a C$_{7-10}$ alkylaryl group, a phenyl group and a phenoxyphenyl group; more preferably a C$_{1-5}$ alkyl group, a phenyl group and a phenoxyphenyl group; most preferably a methyl group, a phenyl group and a phenoxyphenyl group); wherein each Z is independently selected from a hydroxyl group and a C$_{1-10}$ alkoxy group (preferably a hydroxyl group and a C$_{1-4}$ alkoxy group, more preferably a hydroxyl group and a C$_{1-2}$ alkoxy group); wherein 0≦a≦0.005; wherein 0.8495≦b≦0.9995 (preferably 0.9≦b≦0.9995, more preferably 0.9≦b≦0.9992, most preferably 0.95≦b≦0.9992); wherein 0.0005≦c≦0.10 (preferably 0.0008≦c≦0.10, more preferably 0.001≦c≦0.06, most preferably 0.001≦c≦0.02); wherein 0<d≦0.15 (preferably 0<d≦0.099, more preferably 0<d≦0.04, most preferably 0.0005≦d≦0.02); wherein the curable liquid polysiloxane/TiO$_2$ composite contains 20 to 60 mol % TiO$_2$ (based on total solids)(preferably 20 to 58 mol %, more preferably 30 to 58 mol %, most preferably 50 to 58 mol %); wherein each x is independently selected from 0, 1 and 2 (i.e., x can be the same or different for each R$_x^5Z_ySiO_{(4-x-y)/2}$ group); wherein each y is independently selected from 1, 2 and 3 (i.e., y can be the same or different for each R$_x^5Z_ySiO_{(4-x-y)/2}$ group); wherein a+b+c+d=1; wherein the polysiloxane comprises, as initial components: (i) D units having a formula R$^1$(R$^2$)Si(OR$^6$)$_2$; (ii) T units having a formula R$^3$Si(OR$^7$)$_3$; (iii) optionally, M units having a formula R$_3^4$SiOR$^8$; and, (iv) optionally, Q units having a formula Si(OR$^9$)$_4$; wherein each R$^6$, R$^7$, R$^8$ and R$^9$ is independently selected from a hydrogen atom, a C$_{1-10}$ alkyl group, a C$_{7-10}$ arylalkyl group, a C$_{7-10}$ alkylaryl group and a C$_{6-10}$ aryl group; wherein the D units contain >1 ppb to ≦100 ppm (preferably ≦50 ppm; more preferably ≦30 ppm; most preferably ≦10; preferably >1 ppb) in combined total of all the target contaminants having formulae selected from R$^1$—O—(R$^2$)Si(OR$^6$)$_2$; R$^2$—O—(R$^1$)Si(OR$^6$)$_2$; R$^1$(R$^{10}$)Si(OR$^6$)$_2$; and, R$^2$(R$^{11}$)Si(OR$^6$)$_2$; wherein R$^{10}$ is selected from a phenol-oxy-phenyl group and a phenyl-oxy-(hydroxy)phenyl group; wherein the phenol-oxy-phenyl group (if present) is bound with the silicon to form at least one of three different isomers, namely an ortho phenol-oxy-phenyl silane group, a meta phenol-oxy-phenyl silane group, or a para phenol-oxy-phenyl silane group; wherein the phenyl-oxy-(hydroxy)phenyl group (if present) is bound with the silicon to form at least one of three difference isomers, namely an ortho phenyl-oxy-(hydroxy)phenyl silane group, a meta phenyl-oxy-(hydroxy)phenyl silane group, or a para phenyl-oxy-(hydroxy)phenyl silane group; and, wherein R$^{11}$ is a hydroxyphenyl group; and, wherein the curable liquid polysiloxane/TiO$_2$ composite is a liquid at room temperature and atmospheric pressure. Preferably, the curable liquid polysiloxane/TiO$_2$ composite of the present invention exhibits a refractive index of >1.61 to 1.7, more preferably 1.63 to 1.66, most preferably 1.64 to 1.66. Preferably, the curable liquid polysiloxane/TiO$_2$ composite of the present invention exhibits a viscosity of <600,000 Pa*s, more preferably 4 to 100,000 Pa*s, most preferably 4 to 20,000 Pa*s measured under the conditions set forth in the Examples. Preferably, the curable liquid polysiloxane/TiO$_2$ composite of the present invention is thermally curable, optionally with the addition of a catalyst.

Preferably, the D units used to prepare the polysiloxane used in the preparation of the curable liquid polysiloxane/TiO$_2$ composite of the present invention are specifically treated to minimize the content of the target contaminants. Preferably, the D units are treated to contain >1 ppb to ≦100 ppm (preferably ≦50 ppm; more preferably ≦30 ppm; most preferably ≦10 ppm; preferably >1 ppb) in combined total of all of the target contaminants. Preferably, the D units are treated by recrystallization to remove the target contaminants. More preferably, the D units are treated by multiple recrystallizations to remove the target contaminants. Most preferably, the D units are purified by at least three successive recrystallizations to remove the target contaminants. Preferably, the D units can be treated with a nucleophile (e.g., sodium methoxide, potassium methoxide) to convert the target contaminants having formulae $R^1$—O—$(R^2)Si(OR^6)_2$ and $R^2$—O—$(R^1)Si(OR^6)_2$ into materials that are more easily separated from the D units using conventional distillation techniques.

Preferably, the D units used in the preparation of the curable liquid polysiloxane/$TiO_2$ composite have a formula

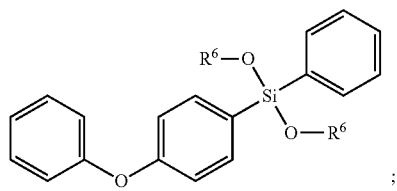

wherein the D units contain >1 ppb to ≦100 ppm (preferably ≦50 ppm; more preferably ≦30 ppm; most preferably ≦10; preferably >1 ppb) in combined total of all of the target contaminants; wherein the target contaminants have formulae selected from

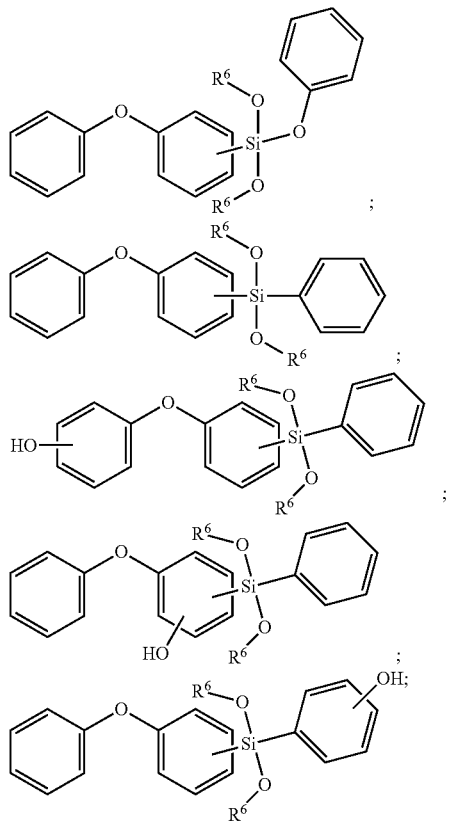

and, wherein each $R^6$ is independently selected from hydrogen and a $C_{1-4}$ alkyl group.

Preferably, the T units used in the preparation of the curable liquid polysiloxane/$TiO_2$ composite have a formula

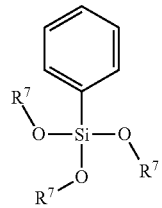

wherein each $R^7$ is independently selected from hydrogen and a $C_{1-4}$ alkyl group (more preferably, wherein each $R^7$ is a methyl group.

Preferably, the curable liquid polysiloxane/$TiO_2$ composite of the present invention is prepared by: (a) combining in an aprotic solvent: (i) D units having a formula $R^1(R^2)Si(OR^6)_2$ (preferably 84.95 to 99.95 mol %, more preferably 90 to 99.95 mol %, still more preferably 90 to 99.92 mol %, most preferably 95 to 99.92 mol % D units); (ii) T units having a formula $R^3Si(OR^7)_3$ (preferably 0.05 to 10 mol %, more preferably 0.08 to 10 mol %, still more preferably 0.1 to 6 mol %, most preferably 0.1 to 2 mol % T units); (iii) optionally, M units having a formula $R_3^4SiOR^8$ (preferably 0 to 0.5 mol % M units); and, (iv) optionally, Q units having a formula $Si(OR^9)_4$ (preferably 0 to 15 mol %, more preferably 0 to 9.9 mol %, still more preferably 0 to 4 mol %, most preferably 0.05 to 2 mol % Q units), wherein each $R^1$ and $R^3$ is independently selected from a $C_{6-10}$ aryl group and a $C_{7-20}$ alkylaryl group (preferably both $R^1$ and $R^3$ are phenyl groups); wherein each $R^2$ is a phenoxyphenyl group, wherein the phenoxyphenyl group is bond with the silicon to form at least one of three different isomers, namely an ortho-phenoxyphenyl silane group, a meta-phenoxyphenyl silane group, or a para-phenoxyphenyl silane group; wherein each $R^4$ is independently selected from a $C_{1-10}$ alkyl group, a $C_{7-10}$ arylalkyl group, a $C_{7-10}$ alkylaryl group and a $C_{6-10}$ aryl group (preferably a $C_{1-5}$ alkyl group, a $C_{7-10}$ arylalkyl group, a $C_{7-10}$ alkylaryl group and a phenyl group; more preferably a $C_{1-5}$ alkyl group and a phenyl group; most preferably a methyl group and a phenyl group); wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group (preferably a hydrogen and a $C_{1-5}$ alkyl group; more preferably a hydrogen and a methyl group; most preferably a methyl group); (b) adding to the combination of (a) an acid (preferably a mineral acid; more preferably a mineral acid selected from hydrochloric acid, nitric acid, phosphoric acid, sulfuric acid, boric acid, hydrofluoric acid and hydrobromic acid; still more preferably a mineral acid selected from hydrochloric acid, nitric acid and sulfuric acid; most preferably hydrochloric acid) in a miscible mixture of water and an alcohol (preferably a $C_{1-8}$ alkyl hydroxide, more preferably methanol, ethanol, propanol, butanol) to form a reaction mixture (preferably, by a drop-wise addition, more preferably by a dropwise addition while maintaining the temperature at 0 to 80° C., most preferably by a dropwise addition while maintaining the temperature at 15 to 70° C.); (c) allowing the reaction mixture to react (preferably, while maintaining the reaction mixture at a temperature of 0 to 80° C.; more preferably, while maintaining the reaction mixture at a temperature of 15 to 70° C.); (d) adding an organo-titanate in an aprotic solvent to the reacted reaction mixture of (c)(preferably by a dropwise addition, more preferably by a dropwise addition while maintaining the temperature at 30 to 100° C., most preferably by a dropwise addition while maintaining the temperature at 70° C.); (e) adding water to the product of (d)(preferably by a dropwise addition, more preferably by a dropwise addition while maintaining the temperature at 30 to 100° C., most preferably by a dropwise addition while maintaining the temperature at 70° C.); (f) heating the product of (e) and allowing it to react to form the curable liquid polysiloxane/$TiO_2$ composite (preferably, the product of (e) is heated to a temperature of ≧60°, more preferably 60 to 150° C.); and, (g) purifying the product of (f) to provide the curable liquid polysiloxane/$TiO_2$ composite (preferably, wherein the curable liquid polysiloxane/$TiO_2$ composite contains 20 to 60 mol % $TiO_2$ (based on total solids)).

The formation of the curable liquid polysiloxane/$TiO_2$ composite in (f) also results in the formation of by-products such as ethanol, methanol, isopropanol and water. These by-products are advantageously removed from the curable liquid polysiloxane/$TiO_2$ composite in (g). Preferably, these by-products are removed from the curable liquid polysiloxane/$TiO_2$ composite in (g) by at least one of distillation and roto-evaporation. Optionally, an extraction solvent can be used to aid in the removal of these by-products. Examples of extraction solvents include $C_{5-12}$ linear, branched and cyclic alkanes (e.g., hexane, heptane and cyclohexane); ethers (e.g., tetrahydrofuran, dioxane, ethylene glycol diether ether and ethylene glycol dimethyl ether); ketones (e.g., methyl isobutyl ketone, methyl ethyl ketone and cyclohexanone); esters (e.g., butyl acetate, ethyl lactate and propylene glycol methyl ether acetate); halogenated solvents (e.g., trichloroethane, bromobenzene and chlorobenzene); silicone solvents (e.g., octamethylcyclotetrasiloxane and decamethylcyclopentasiloxane); and combinations thereof.

Preferably, the acid used in the preparation of the curable liquid polysiloxane/$TiO_2$ composite is selected from Brönsted acids (e.g., acetic acid, formic acid, propionic acid, citric acid, hydrochloric acid, sulfuric acid and phosphoric acid). More preferably, the acid used is hydrochloric acid.

Preferably, the organo-titanate used in the preparation of the curable liquid polysiloxane/$TiO_2$ composite is selected from organo-titanates according to the formula $(R^{12}O)_e Ti_fO_{(f-1)}$; wherein each $R^{12}$ is independently selected from a $C_{1-20}$ alkyl group, a $C_{6-10}$ aryl group, a $C_{7-20}$ alkylaryl group and a $C_{7-20}$ arylalkyl group; wherein f is selected from 1, 2, 3, 4 and 5; and wherein $e=2*(f+1)$. More preferably, the organo-titanate is selected from tetraethyl titanate; tetraisopropyl titanate; tetra-n-propyl titanate; tetra-n-butyl titanate; tetraisooctyl titanate; tetraisostearoyl titanate; tetraoctyleneglycol titanate; ethoxybis(pentane-2,4-dionato-0,0')propan-2-olato) titanium and titanium tetrabutanolate polymer. Most preferably the organo-titante is a titanium tetrabutanolate polymer (e.g., Tyzor® BTP available from Dorf Ketal).

Preferably, the curable liquid polysiloxane/$TiO_2$ composite of the present invention has a purity of ≧95 wt % (more preferably ≧98 wt %). Preferably, the raw materials used in the preparation of the curable liquid polysiloxane/$TiO_2$ composite of the present invention are purified to enhance the purity of the curable liquid polysiloxane/$TiO_2$ composite product. The raw materials used can be purified by, for example, crystallization, distillation, chromatography, solvent extraction, membrane separation and other well known purification processes.

The curable liquid polysiloxane/$TiO_2$ composite optionally further comprise an additive selected from the group consisting of inert diluents; reactive diluents; hindered amine light stabilizers (HALS); lubricity additives; fungicides; flame retardants; contrast enhancers; UV-stabilizers; photo-stabilizers; surfactants; adhesive modifiers; rheology modifiers; phosphors; absorbing dyes; fluorescent dyes; electrical or thermal conductivity additives; chelating or sequestrating agents; acid scavengers; base scavengers; metal passivators; and metal fortifiers.

The light emitting diode manufacturing assembly of the present invention, comprises: a support structure having a plurality of individual semiconductor light emitting diode dies; and, a mold having a plurality of cavities corresponding with the plurality of individual semiconductor light emitting diode dies; wherein the plurality of cavities is filled with a curable liquid polysiloxane/$TiO_2$ composite of the present invention; and wherein the support structure and the mold are oriented such that the plurality of individual semiconductor light emitting diode dies are each at least partially immersed in the curable liquid polysiloxane/$TiO_2$ composite contained in the plurality of cavities. Preferably, each of the cavities in the plurality of cavities is in the shape of a lens. Preferably, the curable liquid polysiloxane/$TiO_2$ composite is heat curable (more preferably, wherein the curable liquid polysiloxane/$TiO_2$ composite is cured upon heating at 100 to 200° C. for 10 to 120 minutes). Preferably, the curable liquid polysiloxane/$TiO_2$ composite when cured both encapsulates the individual semiconductor light emitting diode dies and functions as a lens. The mold optionally further comprises a plurality of feed channels that facilitate injection of the curable liquid polysiloxane/$TiO_2$ composite into the plurality of cavities.

The light emitting diode manufacturing assembly of the present invention facilitates the manufacture of designed manifolds containing multiple individual semiconductor light emitting dies for use in, for example, automobile headlight assemblies. Alternatively, the light emitting diode manufacturing assembly of the present invention facilitates the manufacture of individual semiconductor light emitting diodes. That is, upon curing of the curable liquid polysiloxane/$TiO_2$ composite, the mold can then be separated from the assembly and the plurality of individual semiconductor light emitting diode dies encapsulated by the cured curable polysiloxane/$TiO_2$ composite on the substrate can be diced into multiple individual semiconductor light emitting diodes.

Some embodiments of the present invention will now be described in detail in the following Examples.

Siloxane monomer having the structural formula

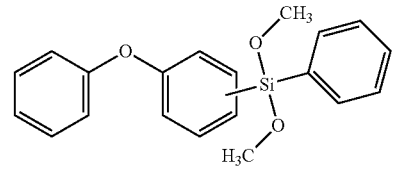

is referred to in the following examples as "POP". The POP monomer used in the following examples was prepared according to the basic procedure described in Example 1.

Siloxane monomer having the structural formula

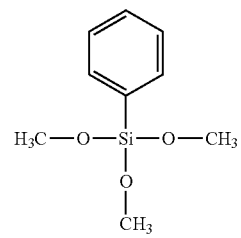

is referred to in the following examples as PTMS and is commercially available from Gelest Inc.

EXAMPLE 1

Distilled POP Monomer Preparation

A 500 mL Schlenk flask was charged with diethyl ether (400 mL); magnesium metal powder (3.3 g; 135 mmol); and methyl iodide (0.1 mL). The flask was then further charged with 4-bromodiphenyl ether (32.161 g; 129 mmol) and the reaction mixture was stirred for 4 hours. Phenyltrimethoxysilane (25.601 g, 129 mmol) was then added to the flask and the contents were then stirred for an additional hour. The contents of the flask were then transferred to a 1 L separatory funnel and the material was washed twice with 400 mL of distilled water. The ether layer was collected and the volatiles were removed under reduced pressure. The crude product was treated by a short path distillation to provide a distilled POP material.

EXAMPLE 2

Purification of Distilled POP Monomer

Distilled POP material prepared according to Example 1 was purified by three (3) successive recrystallizations. Distilled POP (6 g) prepared according to Example 1 was placed in a 30 mL vial to which 15 mL of pentane (HPLC grade from Fisher Scientific) was then added at room temperature. The vial was capped, warmed to 50° C. and then shaken to dissolve the distilled POP material. The capped vial was then placed in a freezer at −20° C. The capped vial was kept in the freezer until the contents of the vial crystallized out of solution. The liquid was then decanted from the crystals and the process was repeated two more times. The crystals were then dried under vacuum at room temperature for an hour to provide a product POP material.

The product POP material was then analyzed by using gas chromatography time of flight mass spectrometry (Agilent 7890 GC/LECO MS) and by using gas cromatography-flame ionization detection (Agilent 7890). The GC-MS of GC-FID was performed using a DB-5 column (DB-5, 30 m×0.32 mm×0.25 μm from Agilent) and a Rtx-200 column (Rtx-200, 30 mm×0.25 mm×1.0 μm from Restek). For the DB-5 column, the temperature profile used was 200° C. for two minutes, followed by a temperature ramp from 200° C. to 300° C. at 5 ° C./min, and then 300° C. for 2 minutes with a column flow rate of 1.5 mL/min. For the Rtx-200 column, the temperature profile used was 200° C. for two minutes, followed by a temperature ramp from 200° C. to 285° C. at 2° C./min and then 285° C. for 2 minutes with a column flow rate of 1.0 mL/min. The injection volume was 1.0 μL and the split ratio was 50:1. The sample was prepared by dissolving 0.10 g of the product POP material in 10 mL of heptane. Area percent analysis of the GC-FID chromatograms was performed to determine the amount of each impurity. The results of the analysis showed that the product POP material contained 20 ppm in combined total of all the target contaminants having formulae selected from the following:

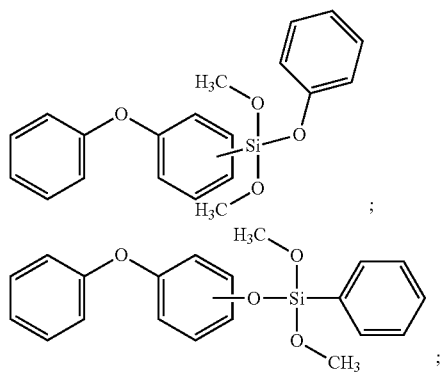

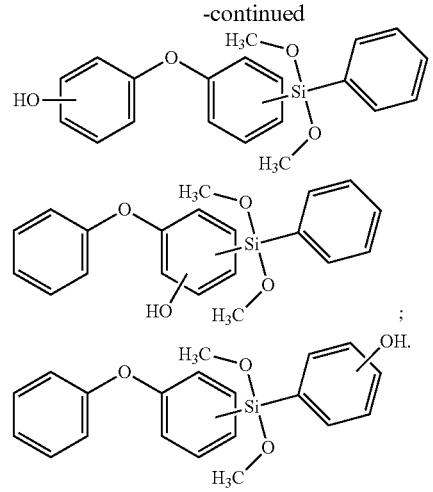

EXAMPLE 3

Purification of Distilled POP Monomer

Distilled POP material prepared according to Example 1 was purified through treatment with a nucleophile. Distilled POP (33.15 g) and 100 mL of dimethoxyethane were added to a 250 mL round bottom flask. The nucleophile solution (2.4 mL of 0.1 N KOCH$_3$ in toluene) was then added to the flask. The flask contents were allowed to react at room temperature for three hours. Hydrochloric acid (24.6 mg of 37 wt % hydrochloric acid solution from Fisher Scientific) was then added to the flask. The flask contents were allowed to react at room temperature for one hour. The solvent was then removed from the flask under vacuum at 60° C. The remaining flask contents were then subjected to short path distillation at 100 mTorr and 200° C. to give a product POP material. The product POP material was then analyzed by GC-MS and GC-FID as described in Example 2 according to the process described. The results of the analysis showed that the product POP material contained 50 ppm in combined total of all the target contaminants having formulae noted in Example 2.

COMPARATIVE EXAMPLE A AND EXAMPLES 4-6

Preparation of Curable Liquid Polysiloxane/TiO$_2$ Composites

Curable liquid polysiloxane/TiO$_2$ composites were prepared using the following general procedure using the specific amounts noted in T$_{ABLE}$ 1. Specifically, the distilled POP prepared according to Example 1 and PTMS in the amounts noted in T$_{ABLE}$ 1 were added with 13.2 g of propylene glycol methyl ether acetate (PGMEA) a 100 mL three-neck round bottom flask. A solution of 5.0 g methanol, 1.0 g water and 0.16 g concentrated hydrochloric acid (37% in water, from Fisher Scientific) was then added to the flask drop wise. The contents of the flask were then heated to 70 ° C. and maintained at that temperature with a constant temperature heating mantle with a thermal probe and reflux condenser for 1.5 hours. Titanium tetrabutanolate polymer (available from DuPont as Tyzor® BTP) in the amount noted in T$_{ABLE}$ 1 dissolved in 8.8 g of PGMEA and 1 mL of dry tetrahydrofuran (THF) was then added to the flask drop wise through an addition funnel while maintaining the temperature of the flask contents at 70° C. for 1 hour. Water (0.1 mL) and PGMEA (4.4 g) were then added to the flask. The contents of the flask were then heated to 100° C. and allowed to react for 1 hour. The volatiles were then distilled out of the flask with a short path distillation column. Volatiles were then further eliminated from the flask contents by roto-evaporation followed by the pulling of a high vacuum (25 mTorr) at 60° C. The product optically clear, curable liquid polysiloxane/TiO$_2$ composite of Examples 4-6 was then recovered from the flask. Note that the reaction described in Comparative Example A yielded a milky white two phase mixture, indicating the formation and aggregation of colloidal TiO$_2$ particles.

TABLE 1

| Ex. # | POP (in g) | PTMS (in g) | Tyzor ® BPT (in g) | POP (in mol %)$^\varsigma$ | PTMS (in mol %)$^\varsigma$ | TiO$_2$ (in mol %)$^n$ |
|---|---|---|---|---|---|---|
| A | 3.4 | 0.106 | 5.45 | 95 | 5 | 67 |
| 4 | 5.9 | 0.212 | 4.54 | 94 | 6 | 49.1 |
| 5 | 5.9 | 0.212 | 5.45 | 94 | 6 | 53.7 |
| 6 | 3.4 | 0.106 | 0.83 | 95 | 5 | 23.6 |

$^\varsigma$ based on total moles of siloxane monomers (POP + PTMS)

$^n$ based on total combined moles of both siloxane monomers (POP + PTMS) and the equivalent molar amount of TiO$_2$ introduced by Tyzor ® BPT incorporation (i.e., three moles of TiO$_2$ for each mole of Tyzor ® BPT)

COMPARATIVE EXAMPLE B AND EXAMPLES 7-10

Preparation of Curable Liquid Polysiloxane/TiO$_2$ Composites

Curable liquid polysiloxane/TiO$_2$ composites were prepared using the following general procedure using the specific amounts noted in TABLE 2. Specifically, the distilled POP prepared according to Example 1 and PTMS in the amounts noted in TABLE 2 were added with 6.6 g of propylene glycol methyl ether acetate (PGMEA) a 100 mL three-neck round bottom flask. A solution of 2.5 g methanol, 0.5 g water and 0.08 g concentrated hydrochloric acid (37% in water, from Fisher Scientific) was then added to the flask drop wise. The contents of the flask were then heated to 70° C. and maintained at that temperature with a constant temperature heating mantle with a thermal probe and reflux condenser for 1.5 hours. Titanium tetrabutanolate polymer (available from DuPont as Tyzor® BTP) in the amount noted in TABLE 2 dissolved in 4.4 g of PGMEA and 0.5 mL of dry tetrahydrofuran (THF) was then added to the flask drop wise through an addition funnel while maintaining the temperature of the flask contents at 70° C. for 1 hour. Water (0.05 mL) and PGMEA (2.2 g) were then added to the flask. The contents of the flask were then heated to 100 ° C. and allowed to react for 1 hour. The volatiles were then distilled out of the flask with a short path distillation column. Volatiles were then further eliminated from the flask contents by roto-evaporation followed by the pulling of a high vacuum (25 mTorr) at 60° C. The product optically clear, curable liquid polysiloxane/TiO$_2$ composite was then recovered from the flask.

TABLE 2

| Ex. # | POP (in g) | PTMS (in g) | Tyzor ® BPT (in g) | POP (in mol %)$^\varsigma$ | PTMS (in mol %)$^\varsigma$ | TiO$_2$ (in mol %)$^n$ |
|---|---|---|---|---|---|---|
| B | 2.9 | 0.085 | 0 | 95 | 5 | 0 |
| 7 | 2.9 | 0.106 | 1.36 | 94 | 6 | 37 |
| 8 | 2.95 | 0.018 | 2.63 | 99 | 1 | 54 |
| 9 | 2.9 | 0.02 | 0.7 | 99 | 1 | 24 |
| 10 | 3.1 | 0.21 | 3.05 | 90 | 10 | 24 |

$^\varsigma$ based on total moles of siloxane monomers (POP + PTMS)

$^n$ based on total combined moles of both siloxane monomers (POP + PTMS) and the equivalent molar amount of TiO$_2$ introduced by Tyzor ® BPT incorporation (i.e., three moles of TiO$_2$ for each mole of Tyzor ® BPT)

EXAMPLES 11-14

Preparation of Curable Liquid of Polysiloxane/TiO$_2$ Composites

Curable liquid polysiloxane/TiO$_2$ composites were prepared using the following general procedure using the specific amounts noted in TABLE 3. Specifically, the distilled POP prepared according to Example 1 and PTMS in the amounts noted in TABLE 3 were added with 15 mL of propylene glycol methyl ether acetate (PGMEA) a 100 mL three-neck round bottom flask. A solution of 5 g methanol, 1 g water and 0.16 g concentrated hydrochloric acid (37% in water, from Fisher Scientific) was then added to the flask drop wise. The contents of the flask were then heated to 70° C. and maintained at that temperature with a constant temperature heating mantle with a thermal probe and reflux condenser for 1.5 hours. Titanium tetrabutanolate polymer (available from DuPont as Tyzor® BTP) in the amount noted in TABLE 3 dissolved in 10 mL of PGMEA and 1 mL of dry tetrahydrofuran (THF) was then added to the flask drop wise through an addition funnel while maintaining the temperature of the flask contents at 70° C. for 1 hour. Water (0.1 mL) and PGMEA (5 mL) were then added to the flask. The contents of the flask were then heated to 100° C. and allowed to react for 1 hour. Volatiles were then further eliminated from the flask contents by roto-evaporation under a high vacuum at 60° C. The product optically clear, curable liquid polysiloxane/TiO$_2$ composite was then recovered from the flask.

TABLE 3

| Ex. # | POP (in g) | PTMS (in g) | Tyzor ® BPT (in g) | POP (in mol %)$^\varsigma$ | PTMS (in mol %)$^\varsigma$ | TiO$_2$ (in mol %)$^n$ |
|---|---|---|---|---|---|---|
| 11 | 5.907 | 0.0035$^t$ | 5.465 | 99.9 | 0.1 | 55.3 |
| 12 | 5.911 | 0.0175 | 5.450 | 99.5 | 0.5 | 55.0 |
| 13 | 5.902 | 0.108 | 5.472 | 97.0 | 3.0 | 54.6 |
| 14 | 5.905 | 0.224 | 5.460 | 94.0 | 6.0 | 53.7 |

$^t$ 4.7 μL of PTMS material was added to the solution, which amount contained about 0.0035 g of the monomer.

$^\varsigma$ based on total moles of siloxane monomers (POP + PTMS)

$^n$ based on total combined moles of both siloxane monomers (POP + PTMS) and the equivalent molar amount of TiO$_2$ introduced by Tyzor ® BPT incorporation (i.e., three moles of TiO$_2$ for each mole of Tyzor ® BPT)

COMPARATIVE EXAMPLES C-D

Composites were prepared using the following general procedure using the specific amounts noted in TABLE 4. Specifically, POP monomer in the amount noted in TABLE 4 was added with 6.6 g of propylene glycol methyl ether acetate (PGMEA) a 100 mL three-neck round bottom flask. A solution of 2.5 g methanol, 0.5 g water and 0.08 g concentrated hydrochloric acid (37% in water, from Fisher Scientific) was then added to the flask drop wise. The contents of the flask were then heated to 70° C. and maintained at that temperature with a constant temperature heating mantle with a thermal probe and reflux condenser for 1.5 hours. Titanium tetrabutanolate polymer (available from DuPont as Tyzor® BTP) in the amount noted in TABLE 4 dissolved in 4.4 g of PGMEA and 0.5 mL of dry tetrahydrofuran (THF) was then added to the flask drop wise through an addition funnel while maintaining the temperature of the flask contents at 70° C. for 1 hour. Water (0.05 mL) and PGMEA (2.2 g) were then added to the flask. The contents of the flask were then heated to 100° C. and allowed to react for 1 hour. The product obtained in each of Comparative Examples C and D was milky white and completely opaque, indicating the formation and aggregation of colloidal TiO$_2$ particles.

TABLE 4

| Ex. # | POP (in g) | Tyzor ® BPT (in g) | TiO$_2$ (in mol %)[a] |
|---|---|---|---|
| C | 2.9 | 0.7 | 24.4 |
| D | 2.9 | 2.6 | 54.5 |

[a] based on moles of POP and the equivalent molar amount of TiO$_2$ introduced by Tyzor ® BPT incorporation (i.e., three moles of TiO$_2$ for each mole of Tyzor ® BPT)

COMPARATIVE EXAMPLE E

One Step Preparation

POP (2.9 g) and PTMS (0.09 g) dissolved in 6.6 grams of propylene glycol methyl ether acetate (PGMEA), and Tyzor® BTP (0.72 g) dissolved in 4.4 g of PGMEA and 0.5 mL of dry tetrahydrofuran (THF) were charged to a 100 mL round bottom flask. A solution of 2.5 g methanol, 0.5 g water and 0.08 g concentrated hydrochloric acid (37% in water, from Fisher Scientific) was then added to the flask drop wise. The contents of the flask were then heated to 70° C. and maintained at that temperature with a constant temperature heating mantle with a thermal probe and reflux condenser for 1.5 hours. The resulting product was milky white and completely opaque, indicating the formation and aggregation of colloidal TiO$_2$ particles.

COMPARATIVE EXAMPLES VA AND VC-VE, AND EXAMPLES V4-V13

The viscosity of each of the products from Comparative Examples A and C-E and Examples 4-13 was assessed in Comparative Examples VA and VC-VE, and Examples V4-V13, respectively, using the following general procedure using a Rheometrics Mechanical Spectrometer (RMS-800) made by Rheometric Scientific Inc. (currently TA Instruments, New Castle, Del.). Specifically, in each instance a sample of the material to be tested was loaded and sandwiched between two aluminum parallel plates of 8 mm diameter. The rheometer fixtures and plates were preheated to 60° C. and equilibrated at this temperature for 15 minutes before zeroing the gap between the plates. The temperature of the parallel plates was then increased to 90° C. for liquid samples having viscosities greater than 100 Pa·s to facilitate the sample loading. After loading the sample material onto the bottom plate, the instrument was placed on HOLD until the oven cooled back to 60° C. The sample gap was then adjusted to 0.5 mm. Extra sample loaded onto the bottom plate that was squeezed out to the edge of the parallel plates during the gap setting was trimmed away using a spatula. The sample gap was then recorded from the instrument micrometer once the temperature reached equilibrium (after about 15 min). A dynamic frequency sweep was then commenced from 100 rad/s to 0.1 rad/s at a strain level within the linear viscoelastic range. The complex shear viscosity was recorded as a function of frequency. The viscosity data at 60° C. and 10 rad/s is reported in TABLE 5 to indicate the relative ease with which each sample material flowed.

TABLE 5

| Ex. | Material Tested | Viscosity (in Pa·s) |
|---|---|---|
| VA | Product of A | solid |
| VC | Product of C | not measured (NM), Product of C was two phase |
| VD | Product of D | NM, Product of D was two phase |
| VE | Product of E | NM, Product of E was two phase |
| V4 | Product of Ex. 4 | 8.1 × 10$^4$ |
| V5 | Product of Ex. 5 | 5.2 × 10$^5$ |
| V6 | Product of Ex. 6 | 4.2 |
| V7 | Product of Ex. 7 | 1.4 × 10$^2$ |
| V8 | Product of Ex. 8 | 1.4 × 10$^3$ |
| V9 | Product of Ex. 9 | 7.8 |
| V10 | Product of Ex. 10 | 29 |
| V11 | Product of Ex. 11 | 6.8 × 10$^4$ |
| V12 | Product of Ex. 12 | 1.1 × 10$^4$ |
| V13 | Product of Ex. 13 | 8.2 × 10$^3$ |

COMPARATIVE EXAMPLE RB AND EXAMPLES R4-R14

Refractive Indexes

The refractive index of the products from Comparative Example B and Examples 4-14 were determined by visual observation in Comparative Example RB and Examples R4-R14, respectively, using an Atago Digital Refractometer (Model: RX-7000α) at sodium D-line. The results are reported in TABLE 6.

TABLE 6

| Ex. | Material Tested | RI (at 589 nm) |
|---|---|---|
| RB | Product of B | 1.608 |
| R4 | Product of Ex. 4 | 1.641 |
| R5 | Product of Ex. 5 | 1.650 |
| R6 | Product of Ex. 6 | 1.621 |
| R7 | Product of Ex. 7 | 1.637 |
| R8 | Product of Ex. 8 | 1.648 |
| R9 | Product of Ex. 9 | 1.632 |
| R10 | Product of Ex. 10 | 1.635 |
| R11 | Product of Ex. 11 | 1.651 |
| R12 | Product of Ex. 12 | 1.648 |
| R13 | Product of Ex. 13 | 1.650 |
| R14 | Product of Ex. 14 | 1.650 |

EXAMPLE S4

The average TiO$_2$ domain size in the curable liquid polysiloxane/TiO$_2$ composite prepared according to Example 5 was determined to be about 3 nm by transmission electron microscopy (TEM) using a JEOL 2010F field emission transmission electron microscope operating at 200 keV and equipped with a Bruker XFlash® 5030 SDD silicon drift energy dispersive x-ray detector.

EXAMPLE S11

The average TiO$_2$ domain size in the curable liquid polysiloxane/TiO$_2$ composite prepared according to Example 11 was determined to be <5 nm with a JEOL JEM 1230 transmission electron microscopy operated at a 100 kV accelerating voltage, using Gatan 791 and Gatan 794 digital cameras to capture the bright field images at −70° C. and post processing the images using Adobe Photoshop 7.0.

EXAMPLES C11-C14

In Examples C11-C14 a sample of the curable liquid polysiloxane/TiO$_2$ composite prepared according to each of Examples 11-14, respectively, was thermally cured. In each of Examples C11-C14 a sample of the curable liquid polysiloxane/TiO$_2$ composite material was placed in a convection oven set at 120° C. for one hour. In each of Examples C11-

C14, the initially liquid composite material was fully cured into a rigid solid following the thermal treatment in the convection oven.

We claim:

1. A curable liquid polysiloxane/$TiO_2$ composite for use as a light emitting diode encapsulant, comprising:
   a polysiloxane with $TiO_2$ domains having an average domain size of less than 5 nm;
   wherein the polysiloxane has an average compositional formula:

$(R_3^4SiO_{1/2})_a(R^1(R^2)SiO_{2/2})_b(R^3SiO_{3/2})_c$
   $(R_x^5Z_ySiO_{(4-x-y)/2})_d$ wherein each $R^1$ and $R^3$ is independently selected from a $C_{6-10}$ aryl group and a $C_{7-20}$ alkylaryl group; wherein each $R^2$ is a phenoxyphenyl group; wherein each $R^4$ is independently selected from a $C_{1-10}$ alkyl group, a $C_{7-10}$ arylalkyl group, a $C_{7-10}$ alkylaryl group and a $C_{6-10}$ aryl group; wherein each $R^5$ is independently selected from a $C_{1-10}$ alkyl group, a $C_{7-10}$ arylalkyl group, a $C_{7-10}$ alkylaryl group, a $C_{6-10}$ aryl group and a phenoxyphenyl group;
   wherein each Z is independently selected from a hydroxyl group and a $C_{1-10}$ alkoxy group;
   wherein $0 \leq a \leq 0.005$;
   wherein $0.8495 \leq b \leq 0.9995$;
   wherein $0.0005 \leq c \leq 0.10$;
   wherein $0 < d \leq 0.15$;
   wherein each x is independently selected from 0, 1 and 2;
   wherein each y is independently selected from 1, 2 and 3;
   wherein $a+b+c+d=1$;
   wherein the polysiloxane comprises, as initial components:
   (i) D units having a formula $R^1(R^2)Si(OR^6)_2$;
   (ii) T units having a formula $R^3Si(OR^7)_3$;
   (iii) optionally, M units having a formula $R_3^4SiOR^8$; and,
   (iv) optionally, Q units having a formula $Si(OR^9)_4$;
   wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group;
   wherein the D units contain >1 ppb to ≤100 ppm in combined total of all target contaminants having formulae selected from $R^1$—O—$(R^2)Si(OR^6)_2$;

$R^2$—O—$(R^1)Si(OR^6)_2$;

$R^1(R^{10})Si(OR^6)_2$; and, $R^2(R^{11})Si(OR^6)_2$;

wherein $R^{10}$ is selected from a phenol-oxy-phenyl group and a phenyl-oxy-(hydroxy)phenyl group and wherein $R^{11}$ is a hydroxyphenyl group;
   wherein the curable liquid polysiloxane/$TiO_2$ composite contains 20 to 60 mol % $TiO_2$ (based on total solids); and, wherein the curable liquid polysiloxane/$TiO_2$ composite exhibits a refractive index of >1.61 to 1.7 and wherein the curable liquid polysiloxane/$TiO_2$ composite is a liquid at room temperature and atmospheric pressure.

2. The curable liquid polysiloxane/$TiO_2$ composite of claim 1, wherein the curable liquid polysiloxane/$TiO_2$ composite is prepared by:
   (a) combining in an aprotic solvent:
      (i) the D units;
      (ii) the T units;
      (iii) any optional M units; and,
      (iv) any optional Q units;
   (b) adding to the combination of (a) an acid in a miscible mixture of water and an alcohol to form a reaction mixture;
   (c) allowing the reaction mixture to react;
   (d) adding an organo-titanate in an aprotic solvent to the reacted reaction mixture of (c);
   (e) adding water to the product of (d);
   (f) heating the product of (e) and allowing it to react; and,
   (g) purifying the product of (f) to provide the curable liquid polysiloxane/$TiO_2$ composite.

3. The curable liquid polysiloxane/$TiO_2$ composite of claim 2, wherein the curable liquid polysiloxane/$TiO_2$ composite provided has a purity of ≥95 wt %.

4. The curable liquid polysiloxane/$TiO_2$ composite of claim 3, wherein the D units have a formula

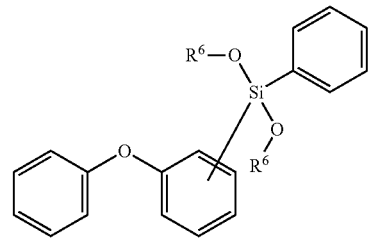

wherein the target contaminants have formulae selected from

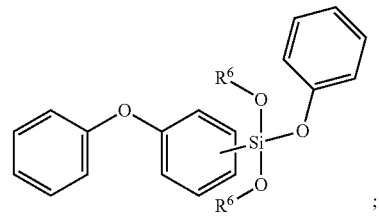

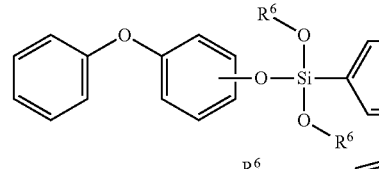

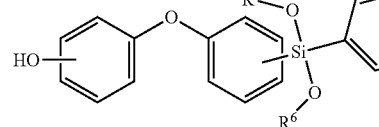

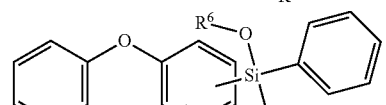

; and,

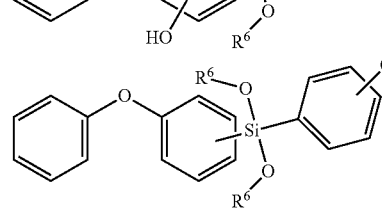

and, wherein each $R^6$ is independently selected from hydrogen and a $C_{1-4}$ alkyl group.

5. The curable liquid polysiloxane/$TiO_2$ composite of claim 4, wherein each $R^6$ is a methyl group.

6. The curable liquid polysiloxane/$TiO_2$ composite of claim 4, wherein the T units have a formula

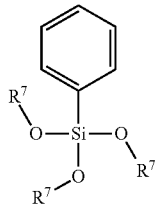

wherein each $R^7$ is independently selected from hydrogen and a $C_{1-4}$ alkyl group.

7. The curable liquid polysiloxane/$TiO_2$ composite of claim 6, wherein each $R^7$ is a methyl group.

8. A light emitting diode manufacturing assembly, comprising:
 a support structure having a plurality of individual semiconductor light emitting diode dies; and,
 a mold having a plurality of cavities corresponding with the plurality of individual semiconductor light emitting diode dies;
 wherein the plurality of cavities is filled with a curable liquid polysiloxane/$TiO_2$ composite of claim 1; and
 wherein the support structure and the mold are oriented such that the plurality of individual semiconductor light emitting diode dies are each at least partially immersed in the curable liquid polysiloxane/$TiO_2$ composite contained in the plurality of cavities.

9. The light emitting diode manufacturing assembly of claim 8, wherein the cavities are in the shape of lenses.

10. The light emitting diode manufacturing assembly of claim 8, wherein the mold further comprises a plurality of feed channels that facilitate injection of the curable liquid polysiloxane/$TiO_2$ composite into the plurality of cavities.

* * * * *